United States Patent
Jenq

[11] Patent Number: 5,981,330
[45] Date of Patent: Nov. 9, 1999

[54] PROCESS FOR FABRICATING BITLINES

[75] Inventor: Jason Jenq, Pingtung, Taiwan

[73] Assignee: United Microelectronics Corp., Taiwan

[21] Appl. No.: 09/034,792

[22] Filed: Mar. 3, 1998

[30] Foreign Application Priority Data

Dec. 19, 1997 [TW] Taiwan .................................. 86119313

[51] Int. Cl.$^6$ .............................................. H01L 21/8242
[52] U.S. Cl. .......................... 438/238; 438/253; 438/647; 438/648; 438/649; 438/666; 438/256
[58] Field of Search ........................... 438/238, 253–256, 438/647–649, 666, 381, 396–399

[56] References Cited

U.S. PATENT DOCUMENTS 5,231,052  7/1993  Lu et al. .
5,565,708  10/1996  Ohsaki et al. ........................... 257/764

Primary Examiner—Jey Tsai
Attorney, Agent, or Firm—Thomas, Kayden, Horstemeyer & Risley, LLP

[57] ABSTRACT

A process for fabricating bitlines for DRAM devices having improved bitline electrical contact is disclosed. Good electrical connection for the bitline in its contact opening is secured by forming a contact interface utilizing titanium silicide. The process includes first forming contact openings revealing the source/drain regions of the transistor of the cell units followed by the formation of a polysilicon layer filling into the openings and contacting the revealed surface of the transistor source/drain regions. A tungsten silicide layer then covers the polysilicon layer, with a titanium layer further covering the tungsten silicide layer, and the polysilicon layer in the contact opening exposed out of coverage by the tungsten silicide layer due to insufficient step coverage of the tungsten silicide layer in the openings. A titanium nitride layer then covers the titanium layer, with a titanium silicide layer interfacing between the polysilicon layer and the tungsten silicide filled inside the openings.

11 Claims, 3 Drawing Sheets

PROCESS FOR FABRICATING BITLINES

CROSS-REFERENCE TO RELATED APPLICATION

This application claims the priority benefit of Taiwan application serial no. 86119313, filed Dec. 19, 1997, the full disclosure of which is incorporated herein by reference.

BACKGROUND OF THE INVENTION

1. Field of the Invention

This invention relates in general to a process for fabricating bitlines for semiconductor DRAM devices and, in particular, to a process for fabricating bitlines for DRAM devices having reduced contact resistance and improved reliability.

2. Description of Related Art

A typical fabrication process for DRAM devices is the so-called 4P2M process that incorporates four layers of polysilicon and two layers of metal interconnections. The first of the four polysilicon layers employed, as viewed from the bottom of the substrate, is the polysilicon layer for the transistor gate electrode. The second layer is the polysilicon for the bottom electrode of the storage capacitor of the memory cell unit. The third is the polysilicon for the top electrode of the storage capacitor, and the fourth is the one for bitlines. On the other hand, the two layers of metal interconnections are used to connect all the circuitry configurations embedded in the substrate, including the four polysilicon layers.

For the fabrication of the bitlines in typical DRAM devices, polycide made from the composition of doped polysilicon and tungsten silicide ($WSi_x$) is frequently used to form the electrical conductor paths in the device. In forming this polycide, tungsten silicide is normally obtained in a deposition procedure employing a gas supply containing tungsten hexafluoride that is used in chemical reaction with silane ($SiH_4$).

As a material for the contact plugs for DRAM bitlines, tungsten silicide is advantageous in that the phenomenon of static charge capacitance can be reduced in order to improve the device operating speed. However, tungsten silicide has a principle drawback when used to fabricate contact plugs for bitlines. Tungsten silicide is characterized by its relatively poor step coverage when deposited. Therefore, when there is large aspect ratio arising in the structural configuration of the device substrate, tungsten silicide is less capable of achieving good contact with the fourth polysilicon layer of the DRAM device. Total coverage by tungsten silicide is, in general, very difficult to achieve.

In order to solve this problem, di-chloro-silane (DCS) was proposed to replace silane that was used to react with the tungsten hexafluoride-containing gas in the chemical vapor deposition (CVD) procedure used to deposit tungsten silicide. Although step coverage was indeed improved, however, when the step height in the contact opening formed in the structural configuration is in exceed of about 10 kÅ, there are still the unacceptable step coverage conditions encountered, in particular, in the contact openings for the bitlines.

FIGS. 1A~1D respectively are cross-sectional views of a DRAM device fabricated in a conventional process. In the cross-sectional view of FIG. 1A, a MOS transistor and its corresponding storage capacitor for a memory cell unit of the DRAM device being fabricated has already been formed over the surface of the substrate 10. As illustrated, the MOS transistor of the entire system of the DRAM device includes the source/drain regions 9, the field oxide layer 11, a first polysilicon layer 12, sidewall spacer 13, and a first oxide layer 17. The first polysilicon layer 12 may be a stacked structure including a doped polysilicon layer 16, a tungsten silicide layer 15, and a silicon nitride layer 14 subsequently stack in that order. The first oxide layer 17 is typically formed in a low-pressure CVD (LPCVD) procedure conducted to deposit a tetraethoxysilane (TEOS) oxide. The deposited TEOS oxide layer covers the field oxide layer 11, the first polysilicon layer 12, as well as the sidewall spacer 13. A photolithography procedure is then employed to pattern into the TEOS oxide layer to form the oxide layer 17. Designated areas of the substrate 10 where the source/drain regions 9 of the MOS transistor located are exposed out of the coverage of this oxide layer 17.

The storage capacitor includes a bottom electrode consisting of the second polysilicon layer 18 covered by a hemispherical-grain polysilicon (HSG-Si) layer 19. On top of the bottom electrode is a dielectric structure 20 consisting of a three-layered oxide-nitride-oxide (ONO) configuration in which the oxide may be tantalum oxide ($Ta_2O_5$) and the nitride may be titanium nitride (TiN). The third polysilicon layer 21 constitutes the top electrode for the storage capacitor of the memory cell unit.

Then, as is illustrated in FIG. 1B, a second oxide layer 22 and a borophosilicate glass (BPSG) layer 23 may be deposited subsequently over the surface of the third polysilicon layer 21. The second oxide layer 22 may be deposited, for example, in an atmospheric pressure CVD (APCVD) procedure.

With reference to FIG. IC, a photolithographic procedure is then employed to pattern the BPSG layer 23, the first oxide layer 17 and the second oxide layer 22. The result is the formation of the contact openings 24 for the bitlines which reveal the transistor source/drain regions 9 over the surface of the device substrate 10.

Next, with reference to FIG. 1D, the fourth polysilicon layer 25 is deposited to a thickness of about 1 kÅ. This fourth polysilicon layer covers the BPSG layer 23, as well as fills into the contact openings 24. The fourth polysilicon layer 25 is then subject to an ion implantation procedure that improves electrical conductivity in it. Afterwards, a tungsten silicide layer 26 is deposited to cover the fourth polysilicon layer 25. The tungsten silicide layer 26 may be deposited in an LPCVD procedure employing a reaction gas containing tungsten hexafluoride. This reaction gas is then mixed with silane at a temperature of about 300~400° C. to incur chemical reaction so that tungsten silicide can be deposited to form layer 26. The fourth polysilicon layer 25 and the tungsten silicide layer 26 are then patterned to form bitlines for the memory cell units.

During the process of the formation of tungsten silicide layer 26, it is found that it is difficult for tungsten silicide to fill completely into the contact openings 24. Imperfect filling in the openings 24 results in the increase of contact resistance between the bit lines behind the plug formed in the openings 24 and the transistor source/drain regions 9 underneath. Further, due to the fact that tungsten silicide exhibits high coefficient of reflection, necking or V-notching phenomena are observed when photoresist layer is applied over its surface when a procedure of photolithography is in order.

SUMMARY OF THE INVENTION

It is therefore an object of the invention to provide a process for fabricating bitlines for DRAM memory devices that results in improved contact resistance conditions between the plugs formed inside the contact opening and the bitelines leading to the transistor source/drain regions of the cell unit transistor.

The invention achieves the above-identified object by providing a process for fabricating bitlines of memory cell units of DRAM devices that includes the steps of first forming contact openings revealing the source/drain regions of the transistor of the cell units. A polysilicon layer is then formed filling into the openings and contacting the revealed surface of the transistor source/drain regions. A tungsten silicide layer then covers the polysilicon layer. Then, a titanium layer covers the tungsten silicide layer, as well as the polysilicon layer in the contact opening exposed out of coverage by the tungsten silicide layer due to insufficient step coverage of the tungsten silicide layer in the opening. A titanium nitride layer then covers the titanium layer, followed by the formation of a titanium silicide layer interfacing between the polysilicon layer and the tungsten silicide filled inside the opening.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
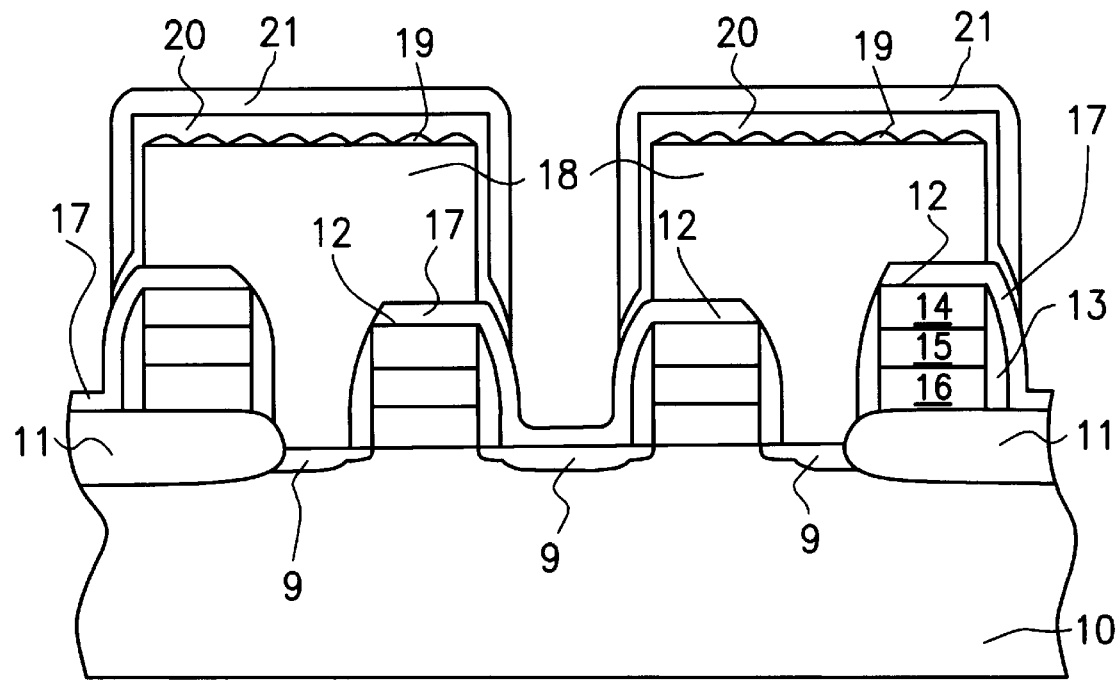
FIGS. 1A~1D are respectively cross-sectional views of a DRAM device depicted from the procdural stages of a conventional fabrication process.
Figure 1B:
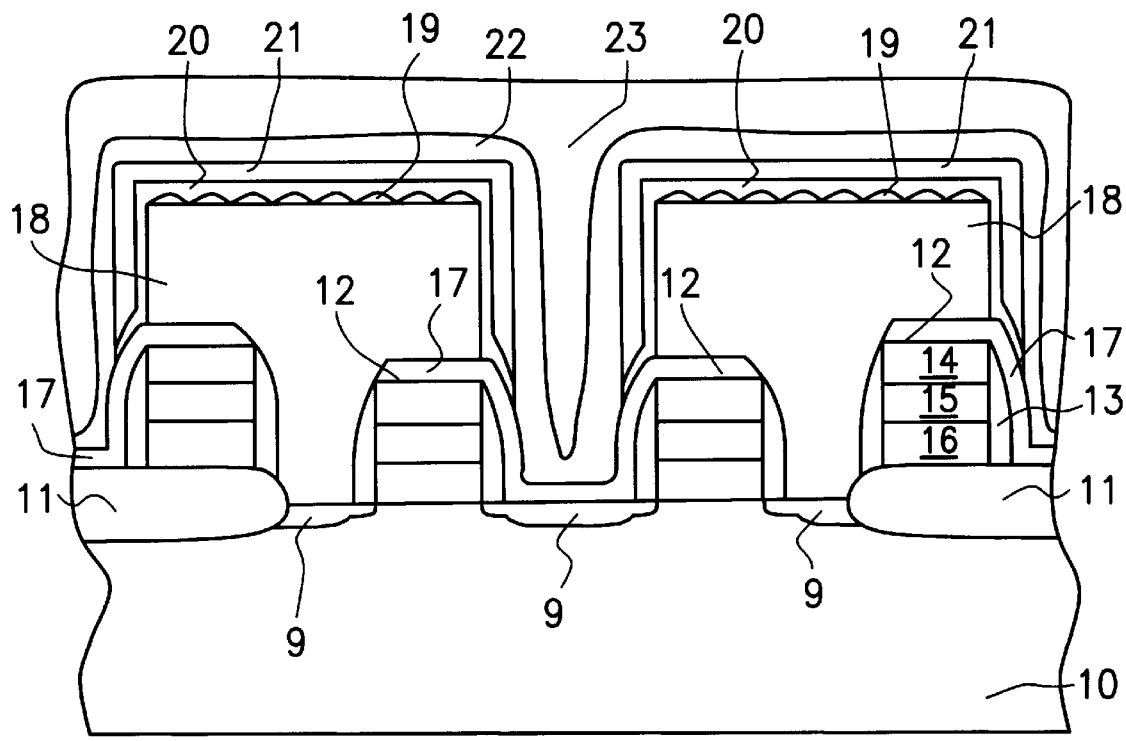
Figure 1C:
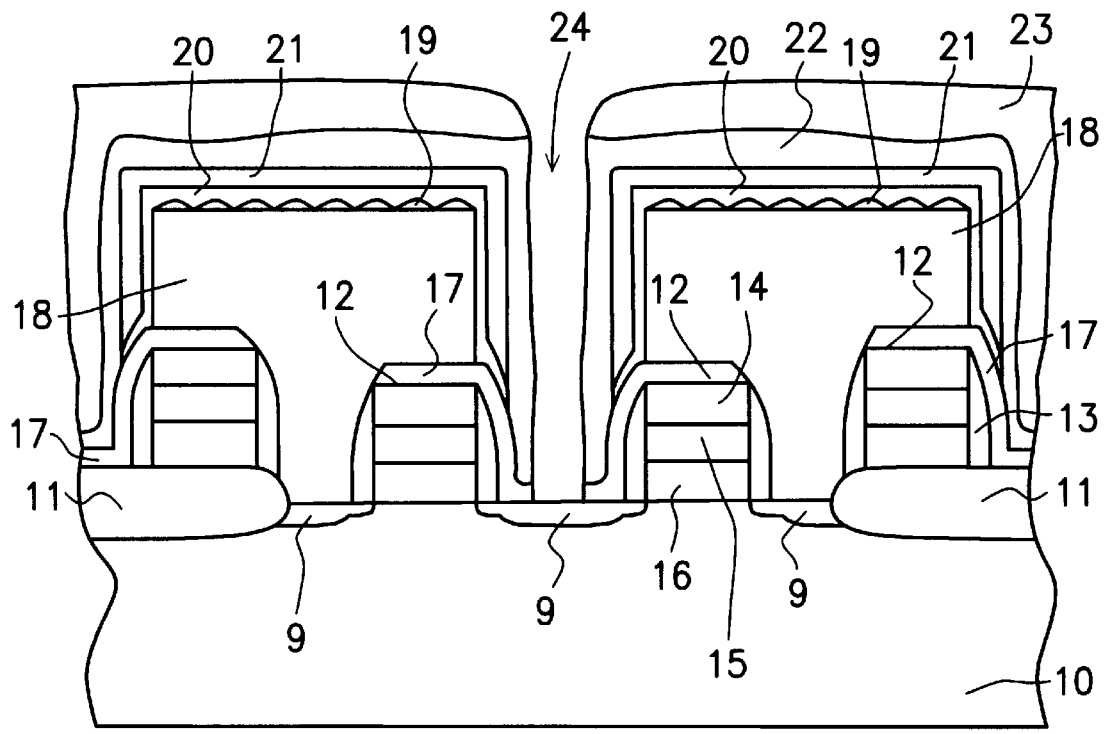
Figure 1D:
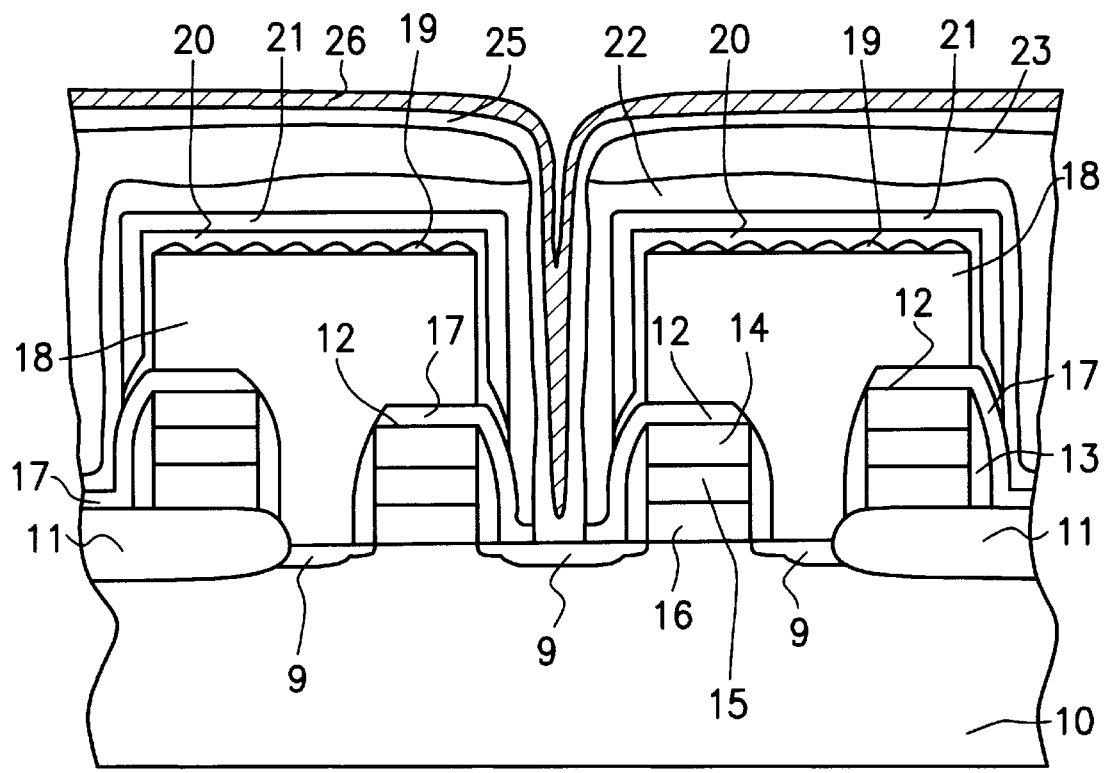
Figure 2A:
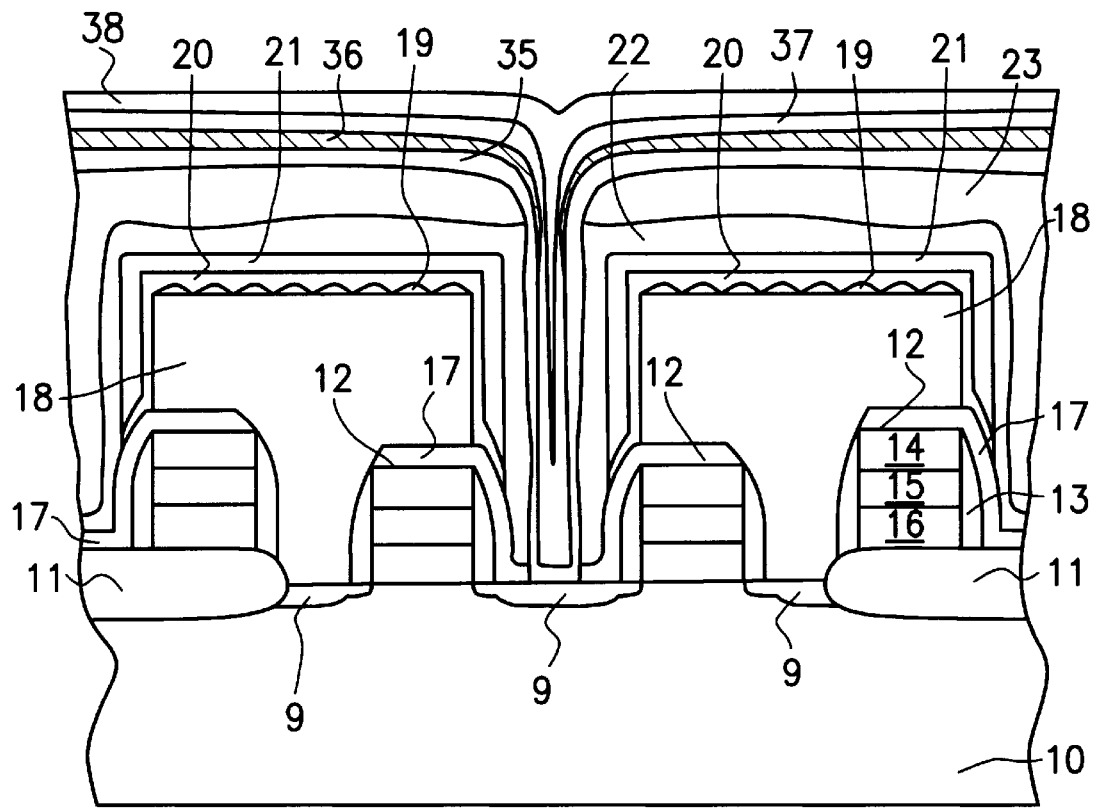
FIGS. 2A and 2B are respectively cross-sectional views of a DRAM device depicted from the process stages of fabrication in accordance with a preferred embodiment of the invention.
Figure 2B:
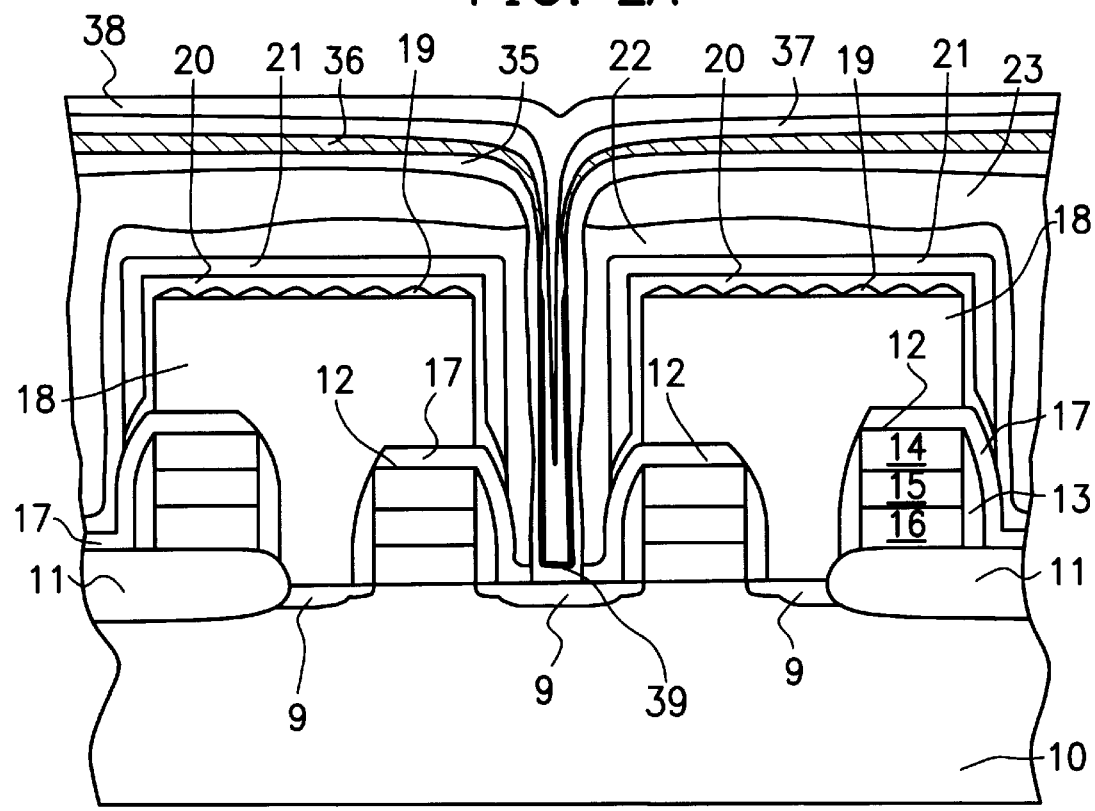

The process for the fabrication of bitlines for DRAM devices according to the disclosure of the invention may be described in a preferred embodiment with reference to FIGS. 2A and 2B. The basic memory cell transistor together with its storage capacitor companion are formed over the surface of the device substrate 10 in the process steps similar to those described with reference to FIGS. 1A~1C. What differs the inventive process for the fabrication of bitlines from those of the prior art may be described with reference to FIGS. 2A and 2B.

First, as is illustrated in FIG. 2A, an LPCVD procedure is employed to deposit a layer of the fourth polysilicon 35 with a thickness of about 1 kÅ for the semiconductor structural system of the DRAM device. This formed fourth polysilicon layer 35 effectively covers the surface of the BPSG layer 23 as well as fills into the aperture region of the contact openings 24 (FIG. 1C). Ions of impurities can then be implanted into the fourth polysilicon layer 35 so as to improve the electrical conductivity.

Then, a tungsten silicide layer 36 is formed over the surface of the fourth polysilicon layer 35. In the procedure, the tungsten silicide layer is formed by deposition in an LPCVD employing a gas supplying tungsten hexafluoride to react with silane under a temperature of about 300~400° C. The tungsten silicide layer is thus formed. Due to the fact that step coverage characteristics for such deposited tungsten silicide layer is inevitably poor, it can therefore be expected that incomplete filling in the contact openings may be observed.

As a result, the process of the invention employs an electrically-conductive material that can exhibit a better step coverage characteristics to fill into the unfilled gaps left in the contact openings. For example, a layer of titanium (Ti) 37 having a thickness of about 500 Å can be formed in a DC sputtering procedure. Afterwards, a layer of titanium nitride (TiN) 38 having a thickness of about 500 Å may be formed in another deposition procedure. Then, a two-stage rapid thermal processing (RTP) can be performed. The first-stage RTP may be conducted at a temperature of about 600° C. in a nitrogen-containing atmosphere and sustains for a time period of about 30 seconds. The second-stage RTP, meanwhile, may be performed at a temperature of about 750° C. also in a nitrogen-containing atmosphere and sustains for a time period of about 20 seconds.

Thus, if the tungsten silicide layer 36 formed previously did not completely fill into the space inside the contact openings 24 formed in the fourth polysilicon layer 35, titanium in the layer 37 may then be diffused into the polysificon layer and react with silicon in the layer 35 under the high temperature of the RTP. This produces a titanium silicide ($TiSi_2$) layer 29 as schematically shown in FIG. 2B by a thick line inside the opening. Titanium silicide is a material with low electrical resistivity, and with the presence of this titanium silicide layer 39, it become a good ohmic contact interfacing between the polysilicon layer 35 and the titanium layer 37. Meanwhile, the tungsten silicide layer covered by the titanium nitride layer 38 is a layer that is able to prevent cracking of the device.

In addition, the tungsten nitride layer 38 also serves as the bottom anti-reflection coating (B-ARC) for the fabricated device when subsequent photolithographic procedure is required. Surface characteristics of the tungsten nitride layer 38 prevents metallic reflections to interfere with the optical exposure illumination of the photoresist. Necking and V-notching phenomena can thus be avoided effectively.

The method of fabricating bitlines for DRAM devices according to the invention can thus provide a lower BC contact resistance to prevent the undesirable phenomenon of poor electric contact that was present in the fourth polysilicon layer and the bitlines of the prior-art devices. This is achieved by the formation of the titanium silicide layer interfacing between the polysilicon layer for the bitlines and tungsten silicide plug connecting to the cell unit transistor source/drain regions of the DRAM device being fabricated. As a result, the fabricated devices are able to perform better and are more reliable.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating bitlines of memory cell units of a dynamic random-access memory device comprising the steps of:

forming contact openings revealing the source/drain regions of the transistor of the cell units;

forming a polysilicon layer filling into the openings and contacting the revealed surface of the transistor source/drain regions;

forming a tungsten silicide layer covering the polysilicon layer;

forming a titanium layer covering the tungsten silicide layer and the polysilicon layer in the contact opening exposed out of coverage by the tungsten silicide layer due to insufficient step coverage of the tungsten silicide layer in the opening;

forming a titanium nitride layer covering the titanium layer; and forming a titanium silicide layer interfacing between the polysilicon layer and the tungsten silicide inside the opening.

2. The process for fabricating bitlines according to claim 1, wherein the polysilicon layer is formed in a low-pressure chemical vapor deposition procedure.

3. The process for fabricating bitlines according to claim 1, wherein the polysilicon layer has a thickness of about 1 Å.

4. The process for fabricating bitlines according to claim 1, wherein the tungsten silicide layer is formed in a low-pressure chemical vapor deposition procedure.

5. The process for fabricating bitlines according to claim 4, wherein the tungsten silicide layer is formed in a low-pressure chemical vapor deposition procedure employing a tungsten hexafluoride-containing gas supply for reacting with silane at a temperature of about 300~400° C.

6. The process for fabricating bitlines according to claim 1, wherein the titanium layer is formed in a DC sputtering procedure.

7. The process for fabricating bitlines according to claim 1, wherein the titanium layer has a thickness of about 500 Å.

8. The process for fabricating bitlines according to claim 1, wherein the titanium nitride layer has a thickness of about 500 Å.

9. The process for fabricating bitlines according to claim 1, wherein the titanium silicide layer is formed in a two-stage rapid thermal processing.

10. The process for fabricating bitlines according to claim 9, wherein the first process of the two-stage rapid thermal process is performed in a gaseous nitrogen-containing environment under a temperature of about 600° C. and sustaining for a time period of about 30 seconds.

11. The process for fabricating bitlines according to claim 9, wherein the second process of the two-stage rapid thermal process is performed in a gaseous nitrogen-containing environment under a temperature of about 750° C. and sustaining for a time period of about 20 seconds.

* * * * *